United States Patent
Deppe et al.

(10) Patent No.: US 7,323,388 B2
(45) Date of Patent: Jan. 29, 2008

(54) SONOS MEMORY CELLS AND ARRAYS AND METHOD OF FORMING THE SAME

(75) Inventors: Joachim Deppe, Dresden (DE); Christoph Ludwig, Langebrück (DE); Christoph Kleint, Dresden (DE); Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 307 days.

(21) Appl. No.: 11/072,695

(22) Filed: Mar. 4, 2005

(65) Prior Publication Data

US 2005/0196923 A1    Sep. 8, 2005

Related U.S. Application Data

(63) Continuation of application No. PCT/DE03/02576, filed on Jul. 31, 2003.

(30) Foreign Application Priority Data

Sep. 4, 2002    (DE) ................. 102 40 893

(51) Int. Cl.
   *H01L 29/417* (2006.01)
(52) U.S. Cl. .............. 438/270; 438/268; 257/330; 257/329; 257/E29.118
(58) Field of Classification Search ......... 438/268, 438/270; 257/330, 329, E29.118
   See application file for complete search history.

(56) References Cited

U.S. PATENT DOCUMENTS 4,047,974 A * 9/1977 Harari ............... 438/288
4,689,871 A * 9/1987 Malhi .................. 438/270
4,774,556 A * 9/1988 Fujii et al. ............ 257/316
5,168,334 A   12/1992 Mitchell et al.
5,349,221 A * 9/1994 Shimoji ................ 257/324
5,386,132 A * 1/1995 Wong .................. 257/316
5,448,090 A   9/1995 Geissler et al.
5,453,637 A * 9/1995 Fong-Chun et al. ....... 257/390
5,518,942 A * 5/1996 Shrivastava ............ 438/264
5,583,065 A * 12/1996 Miwa .................. 438/304
5,595,927 A   1/1997 Chen et al.

(Continued)

FOREIGN PATENT DOCUMENTS

EP    0 783 181 A1    7/1997

(Continued)

OTHER PUBLICATIONS

Nicolet, M.A., et al., "Formation and Characterization of Transition Metal Silicides," VLSI Electronics—Microstructure Science vol. 6, Academic Press, 1983, pp. 330-464.

(Continued)

*Primary Examiner*—Sue A. Purvis
*Assistant Examiner*—Victor A. Mandala, Jr.
(74) *Attorney, Agent, or Firm*—Slater & Matsil, L.L.P.

(57) ABSTRACT

A trench (2) is fabricated in a silicon body (1). The walls (4) of the trench are provided with a nitrogen implantation (6). An oxide layer between the source/drain regions (5) and a word line applied on the top side grows to a greater thickness than a lower oxide layer of an ONO storage layer fabricated as gate dielectric at the trench wall. Instead of the nitrogen implantation into the trench walls, it is possible to fabricate a metal silicide layer on the top sides of the source/drain regions in order to accelerate the oxide growth there.

20 Claims, 4 Drawing Sheets

U.S. PATENT DOCUMENTS

| | | | |
|---|---|---|---|
| 5,739,567 A * | 4/1998 | Wong | 257/316 |
| 5,768,192 A | 6/1998 | Eitan | |
| 5,821,591 A | 10/1998 | Krautschneider et al. | |
| 5,877,537 A * | 3/1999 | Aoki | 257/390 |
| 5,920,779 A * | 7/1999 | Sun et al. | 438/275 |
| 5,943,267 A | 8/1999 | Sekariapuram et al. | |
| 5,981,995 A * | 11/1999 | Selcuk | 257/330 |
| 6,011,725 A | 1/2000 | Eitan | |
| 6,191,459 B1 | 2/2001 | Hofmann et al. | |
| 6,215,148 B1 | 4/2001 | Eitan | |
| 6,239,465 B1 | 5/2001 | Nakagawa | |
| 6,348,711 B1 | 2/2002 | Eitan | |
| 6,362,070 B1 | 3/2002 | Villa et al. | |
| 6,477,084 B1 | 11/2002 | Eitan | |
| 6,664,588 B2 | 12/2003 | Eitan | |
| 6,770,550 B2 * | 8/2004 | Kunikiyo | 438/585 |
| 2001/0005620 A1 * | 6/2001 | Tanigami | 438/584 |
| 2002/0009855 A1 | 1/2002 | Kim | |
| 2002/0123212 A1 | 9/2002 | Kunikiyo | |

FOREIGN PATENT DOCUMENTS

| | | |
|---|---|---|
| EP | 1 049 155 A1 | 11/2000 |
| JP | 1000332237 A | 11/2000 |
| WO | WO 99/60631 A1 | 11/1999 |

OTHER PUBLICATIONS

Zhao, Q.T., et al., "Nanometer patterning of epitaxial $CoSi_2$/Si(100) for ultrashort channel Schottky barrier metal-oxide-semiconductor field effect transistors," Applied Physics Letters, vol. 74, No. 3, Jan. 18, 1999, pp. 454-456.

* cited by examiner

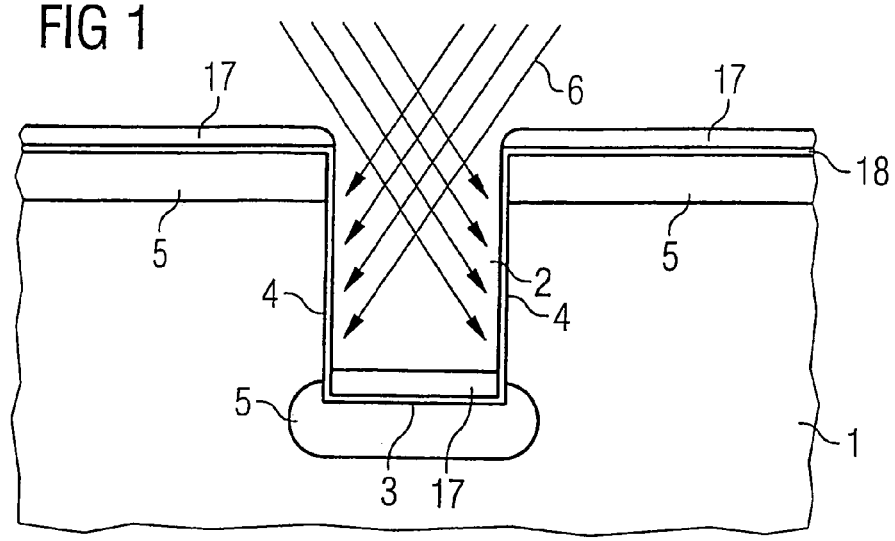
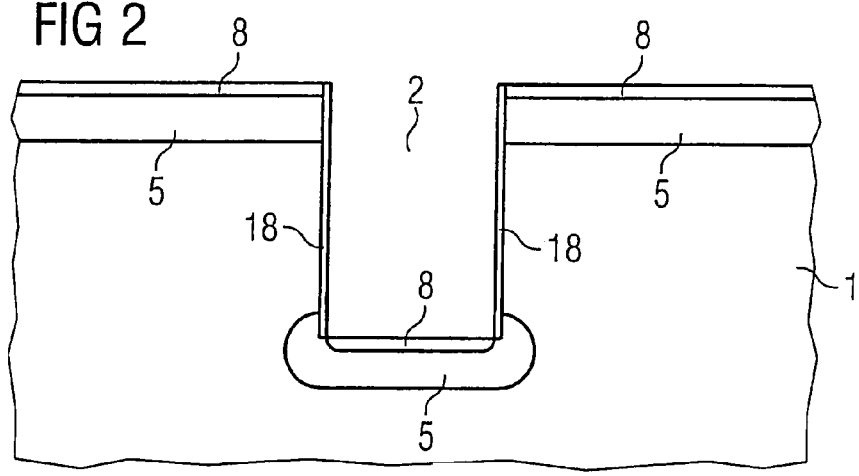
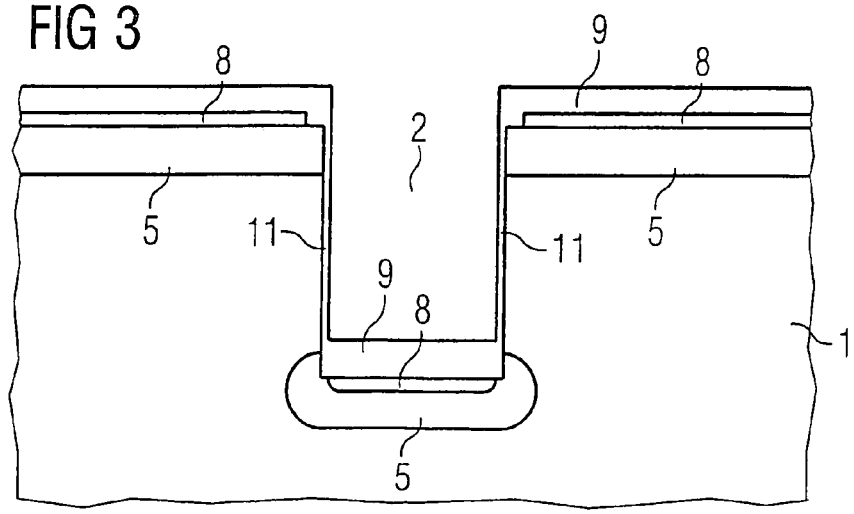

SONOS MEMORY CELLS AND ARRAYS AND METHOD OF FORMING THE SAME

This is a continuation of PCT application PCT/DE03/02576, filed Jul. 31, 2003, which claims priority to German application 102 40 893.9, filed Sep. 4, 2002, both of which are incorporated herein by reference.

TECHNICAL FIELD

The present invention relates to a method for fabricating polysilicon-oxide-nitride-oxide-silicon (SONOS) memory cells, in particular nitride read-only memory (NROM) memory cells, a memory cell that can be fabricated by this method, and a semiconductor memory formed from memory cells of this type.

BACKGROUND

Memory cell arrays comprising NROM memory cells (planar SONOS memory cells that can be programmed by channel hot electrons and can be erased by hot holes, as disclosed in U.S. Pat. No. 5,768,192, U.S. Pat. No. 6,011,725, and PCT Publication WO 99/60631) can be miniaturized more extensively by the memory cells not being arranged in a plane one beside the other, but rather at the walls of trenches etched out at the top side of a semiconductor body. A multiplicity of such trenches run at a distance from and parallel to one another and thus form a kind of comb structure at the surface of the semiconductor body.

The channels of the memory transistors are arranged in vertical fashion at the trench walls. The source and drain regions are arranged at the top side of the semiconductor body in a manner adjoining the trenches and in the trench bottoms. The source/drain regions are connected to bit lines. The gate electrodes of the memory transistors are arranged in the trenches and connected to word lines arranged transversely with respect to the bit lines on the top side of the memory cell array.

The word lines run transversely with respect to the direction of the trenches and therefore have to be electrically insulated from the source and drain regions in the semiconductor material. A thin gate dielectric has to be provided at the trench walls, while a thicker electrically insulating layer has to be provided on the top side of the source and drain regions in order to achieve a sufficient electrical insulation between the word lines and the source and drain regions with a low degree of capacitive coupling.

The gate dielectric is formed by a storage layer sequence, for which an oxide-nitride-oxide layer sequence is usually used, at the walls of the trenches. In this case, the nitride layer is provided as the actual storage layer in which, during the programming of the cell, electrons are trapped between the boundary layers made of oxide (trapping).

The problem that has arisen hitherto is that, in the case of simultaneous fabrication of the lower boundary layer made of oxide and the electrically insulating layer—preferably likewise formed from oxide—on the top sides of the source and drain regions, an oxide growth of uniform thickness forms either a gate dielectric layer that is too thick or an insulation layer that is too thin. An optimum tunnel oxide thickness is about 6 nm, which is too small for the insulation layer on the source and drain regions. For quality reasons, a deposited oxide is suitable as lower boundary layer (tunnel oxide) of the storage layer sequence only to a limited extent.

SUMMARY OF THE INVENTION

In one aspect, the present invention specifies a SONOS memory cell, in particular an NROM memory cell, and a method for fabricating this memory cell in which the lower oxide—applied to the semiconductor material—of the storage layer sequence forming the gate dielectric has a preferred thickness and a sufficient electrical insulation of the word lines from the source and drain regions is simultaneously achieved.

In a method for fabricating memory cells, for example, a trench having a bottom and lateral walls is etched at a top side of a semiconductor body or a semiconductor layer made of silicon. Dopant for forming source and drain regions is introduced into the semiconductor material at the top side of the semiconductor body or the semiconductor layer in a manner adjoining the trench and at the bottom of the trench. The top sides of the source and drain regions are provided with electrically insulating layers. A gate dielectric is fabricated at the walls of the trench and a gate electrode is arranged in the trench and provided with a word line. In one aspect, before the fabrication of the electrically insulating layers, an implantation of nitrogen into the walls of the trench is effected or covering spacers are fabricated at the walls of the trench. A metal silicide layer is fabricated at the top side of the semiconductor body or the semiconductor layer in a manner adjoining the trench and at the bottom of the trench. The metal silicide layer is covered with an oxide layer in order thus to form the electrically insulating layers. The gate dielectric is fabricated as a storage layer with a lower boundary layer made of oxide which is arranged on the walls of the trench.

In another embodiment, a memory cell includes a trench having a bottom and lateral walls. The trench is formed at a top side of a semiconductor body or a semiconductor layer made of silicon. Source and drain regions are formed at the top side of the semiconductor body or the semiconductor layer in a manner adjoining the trench and at the bottom of the trench. The top sides of the source and drain regions are provided with a metal silicide layer. The metal silicide layer is covered with an oxide layer. A storage layer is arranged at the walls of the trench. This storage layer has a lower boundary layer made of oxide, which is arranged directly on the silicon and is thinner than the oxide layer with which the metal silicide layer is covered. A gate electrode connected to a word line is arranged in the trench.

In another embodiment, a number of these memory cells can be arranged as a memory cell array. This array includes a plurality of trenches formed such that they run parallel to one another at a respective distance. Memory cells are arranged in each trench. Trench-type insulation strips are in each case arranged between the trenches, which strips reach at least the depth of the source/drain regions arranged at the bottoms of the trenches. The metal silicide layer is formed as part of the bit lines.

The semiconductor material used is silicon in which a trench or a comb-like trench structure is formed. Metallized bit lines are produced by means of a salicide process (self-aligned silicide), in particular using cobalt silicide. By means of a thermal oxidation, in particular a wet oxidation, an oxide oxidation is produced on the metal silicide, the oxide layer serving to insulate the bit lines. In this case, the lower boundary layer made of oxide (bottom oxide) is produced in the gate dielectric in such a way that the thicknesses of the oxide layers can be set largely independently of one another. In this case, the storage layer sequence is preferably fabricated as an ONO layer sequence (oxide-nitride-oxide).

The comb-like trench structure has horizontal top sides of the source/drain regions and vertical trench walls in which the channel regions are provided. In a first preferred variant of the fabrication method, firstly nitrogen is implanted into the vertical trench walls with the aid of an obliquely directed implantation. The nitrogen in the semiconductor material inhibits a subsequent thermal oxide growth. The nitrogen implant reduces the growth rate of the oxide in comparison with silicon not being implanted with nitrogen by a factor of up to two.

After this nitrogen implantation, a thermal oxidation, preferably a wet oxidation, is carried out in such a way that an oxide layer having a thickness of typically about 6 nm is produced on the trench walls. In the same oxidation process, a significantly thicker oxide ($SiO_2$) is formed on the bit line provided with the metal silicide. The ratio of the layer thicknesses formed can be set in a manner known per se using the conditions of the nitrogen implantation.

In an alternative second preferred variant of the fabrication method, the trench etching is followed by the production of a thermal oxide, which, at the trench walls, serves as a lower boundary layer (bottom oxide of the storage layer sequence to be fabricated) and has a corresponding layer thickness of typically about 6 nm. The trench walls are covered with spacers, which is preferably done by means of a nitride spacer process. The source/drain implantation is then carried out, thereby forming the source/drain regions at the top side in a manner adjoining the trench and in the trench bottom. By means of anisotropic dry etch, the oxide is removed on the horizontal surfaces.

By means of a silicide process with subsequent oxidation, a metal silicide, preferably cobalt silicide with a covering made of $SiO_2$ is fabricated on the source/drain regions in this variant as well. In this case, the spacers at the sidewalls of the trenches prevent a further oxidation of the tunnel oxide on the trench walls, so that a decoupling of the oxide thicknesses is achieved with this variant as well. Following the fabrication of the oxide layers on the source/drain regions, the spacers are removed at the trench walls.

After these method steps, in both of the variants described, in the same way, the storage layer sequence can be completed, the gate electrode can be arranged in the trench and the word line can be applied and patterned. These method steps can be carried out together with the fabrication of driving components of the periphery in a manner known. The lower bit lines of the respectively mutually adjacent trenches of an arrangement formed with cells of this type in a memory cell array are preferably isolated from one another by trench-type insulation strip. These insulation strips are preferably fabricated as STI trenches (shallow trench isolation). A memory cell may be characterized in terms of its minimum feature size (F). A memory cell array formed according to the present invention requires only $2F^2$ areas per bit.

BRIEF DESCRIPTION OF THE DRAWINGS

Examples of the memory cell and preferred fabrication methods are described in more detail below with reference to FIGS. 1 to 9 wherein:

FIGS. 1 to 4 show cross sections through intermediate products of the memory cell after various steps of a first fabrication method;

Figure 4:
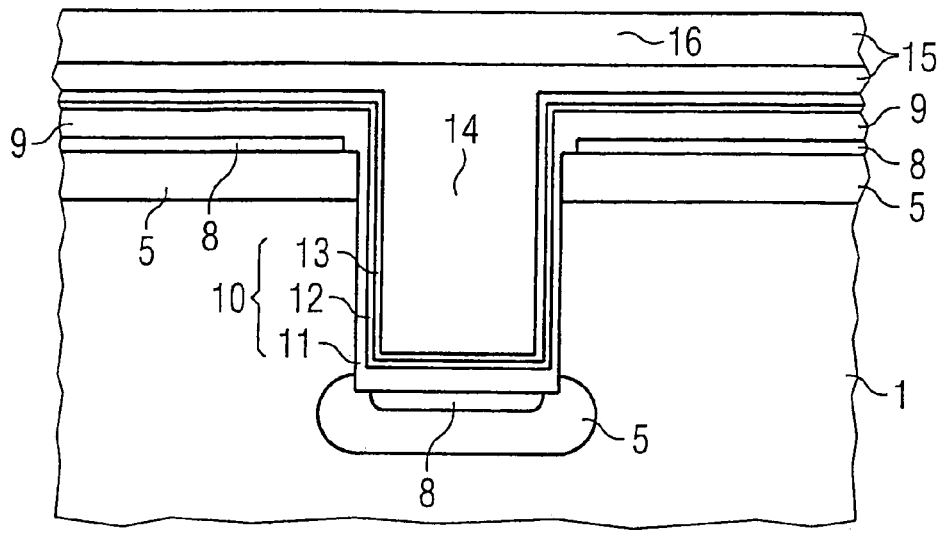

The following reference numerals can be used in conjunction with drawings:

| | |
|---|---|
| 1 | Semiconductor body |
| 2 | Trench |
| 3 | Bottom of the trench |
| 4 | Wall of the trench |
| 5 | Source/drain region |
| 6 | Implantation |
| 7 | Spacer |
| 8 | Metal silicide layer |
| 9 | Oxide layer |
| 10 | Storage layer |
| 11 | Lower boundary layer |
| 12 | Actual storage layer |
| 13 | Upper boundary layer |
| 14 | Gate electrode |
| 15 | Word line |
| 16 | Metal silicide layer of the word line |
| 17 | Resist mask |
| 18 | Thermal oxide |
| 19 | Insulation strip |

DETAILED DESCRIPTION OF ILLUSTRATIVE EMBODIMENTS

A first exemplary embodiment of a preferred fabrication method is described with reference to FIGS. 1 to 4. A preferred exemplary embodiment of the memory cell also results therefrom. FIG. 1 illustrates in cross section a semiconductor body, the semiconductor material may also be a silicon layer on a substrate. The trench has a bottom 3 and lateral walls 4, which, in the diagrammatic cross section of FIG. 1, are depicted as planar and at right angles to one another, but, depending on the etching method used, may also be slightly inclined or rounded with respect to one another. The silicon is preferably provided with a week p-type basic doping.

A dopant, e.g., dopant for n+-type conduction in the example of a p-type basic doping, is introduced, preferably by means of an implantation, into the regions provided for the source and drain regions at the top side of the semiconductor body 1 in a manner adjoining the trench and at the bottom 3 of the trench. In this way, the source and drain regions 5 are formed in the manner depicted. A thin thermal oxide 18 is then fabricated, which is provided as a sacrificial layer, in a particular as a blocking layer for the subsequent salicide process. Using a resist mask 17, which covers the horizontal surface of the semiconductor material, an oblique implantation 6 of nitrogen is introduced is introduced into the walls 4 of the trench 2. The resist mask 17 is subsequently removed.

In accordance with the cross section illustrated in FIG. 2, the thermal oxide 18 is then removed on the horizontal surfaces. This is done, e.g., by means of anisotropic reactive ion etching (RIE). A metallization for forming the bit lines may then be fabricated on the source and drain regions 5. This is done preferably by means of a salicide process, which forms a thin metal silicide layer 8 on the surfaces specified. The fabrication of a cobalt silicide layer ($CoSi_2$) is preferred here. After the fabrication of the metal silicide layer 8, the residual thermal oxide 18 at the walls is removed, e.g., by immersion in HF.

During an oxidation, in particular during a diffusion-controlled wet oxidation, pure $SiO_2$ is formed on $CoSi_2$ and other metal silicides, the silicide layer penetrating deeper into the semiconductor material. The electrical properties of this layer, which are provided for the function as a bit line, are not impaired in this case. The properties of the oxide layer formed thereon are comparable with SiO2 layers that grow directly on a silicon body. The growth rates are essentially independent of the thickness of the metal silicide layer and of the same order of magnitude as on a silicon body.

FIG. 3 illustrates the structure after the oxidation in cross section. Together with the fabrication of the oxide layer 9, a thin lower boundary layer 11 is also fabricated on the walls of the trench. The boundary layer 11 is provided as a lower layer of the storage layer sequence. Owing to the nitrogen implant, the oxide grows more slowly on the walls of the trench 2 than on silicon that has not been implanted with nitrogen. The combination of the metal silicide layer 8 on the top sides of the source and drain regions 5 with the nitrogen implant in the sidewalls of the trench therefore makes it possible for the layer thicknesses of these simultaneously fabricated oxide layers to be defined differently in the manner envisaged. A wet oxidation is primarily suitable for the oxidation.

In accordance with the illustration of FIG. 4, the storage layer 10 is then completed by the application of the actual storage layer 12 and the upper boundary layer 13, over the whole area in this example. The actual storage layer 12 is preferably nitride. The upper boundary layer 13 is preferably oxide again. The storage layer 10 is thus formed as an oxide-nitride-oxide layer sequence in the preferred configuration.

A gate electrode 14 may subsequently be arranged in the trench. This is done preferably by depositing electrically conductive polysilicon into the trench. This material is preferably also deposited on the top side, so that a word line 15 is fabricated by patterning in a manner known. The top side of this word line can be covered with a metal silicide layer 16 or the like. This additional layer is provided for the purpose of reducing the lead resistance of the word line.

Figure 5:
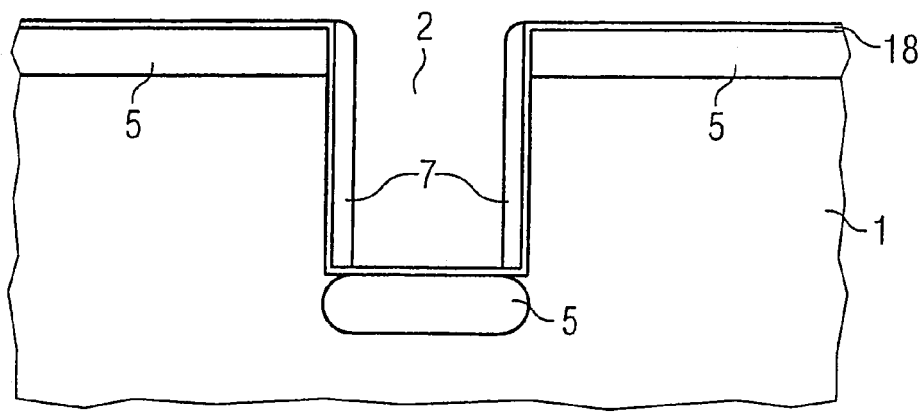
FIGS. 5 to 8 show cross sections through intermediate products of the memory cell after various steps of a second fabrication method.

In a variant of the preferred fabrication method, in accordance with the cross section illustrated in FIG. 5, after the trench etching and the fabrication of the thermal oxide 18, covering spacers 7 are fabricated at the walls of the trench 2. This is done preferably by means of a nitride spacer process. The source and drain regions 5 are formed by an implantation of dopant as described above. The thermal oxide 18 is removed from the horizontal surfaces preferably by wet-chemical means; anisotropic RIE is also possible.

Figure 6:
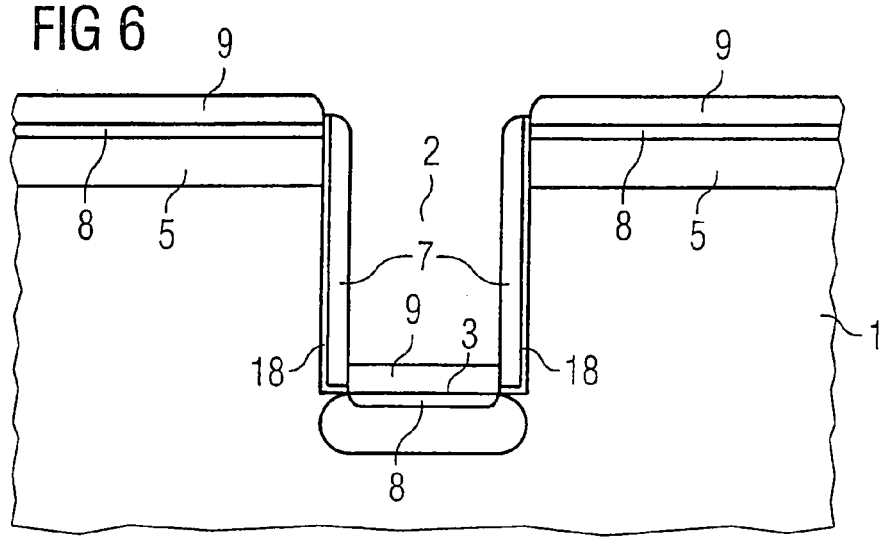

In accordance with the cross section of FIG. 6, the metal silicide layer 8 is fabricated on the source and drain regions 5, preferably by means of a salicide process in this case, too. In this case, too, $CoSi_2$ is preferred as the metal silicide. The covering oxide layer 9 is then produced on the metal silicide layer 8. The covering spacers 7 are then removed selectively with respect to the oxide, which can be done, e.g., by means of phosphoric acid in the case of nitride spacers.

Figure 7:
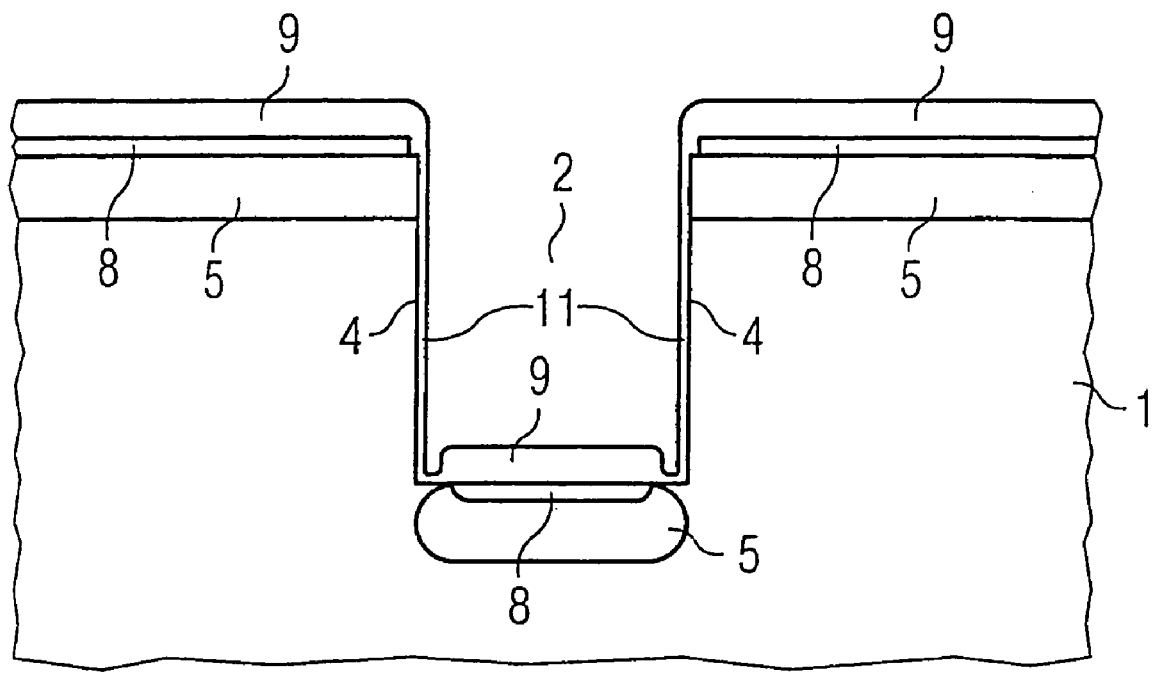

In accordance with FIG. 7, the uncovered oxide 18 can then itself be used as lower boundary layer 11 of the storage layer 10 or else be removed by wet-chemical means, the oxide layer 9 also being thinned. In this case, the lower boundary layer 11 is fabricated by means of a further oxidation. The oxide layer 9 is further reinforced during the oxidation process. The storage layer can subsequently be completed as described above.

Figure 8:
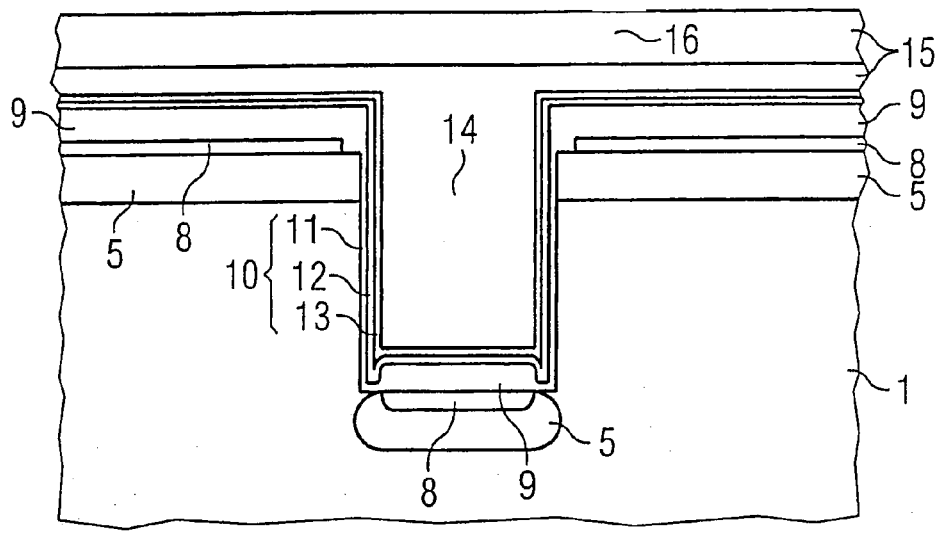

The structure with complete storage layer 10 is illustrated in cross section in FIG. 8. The actual storage layer 12, which is preferably nitride and the upper boundary layer 13, which is preferably oxide, are fabricated over the whole area in this example. The gate electrode 14 is arranged in the trench and may be conductively doped polysilicon in this case, too. The word line 15, which may, if appropriate, comprise a metal silicide layer 16, is applied and patterned in the manner described.

Figure 9:
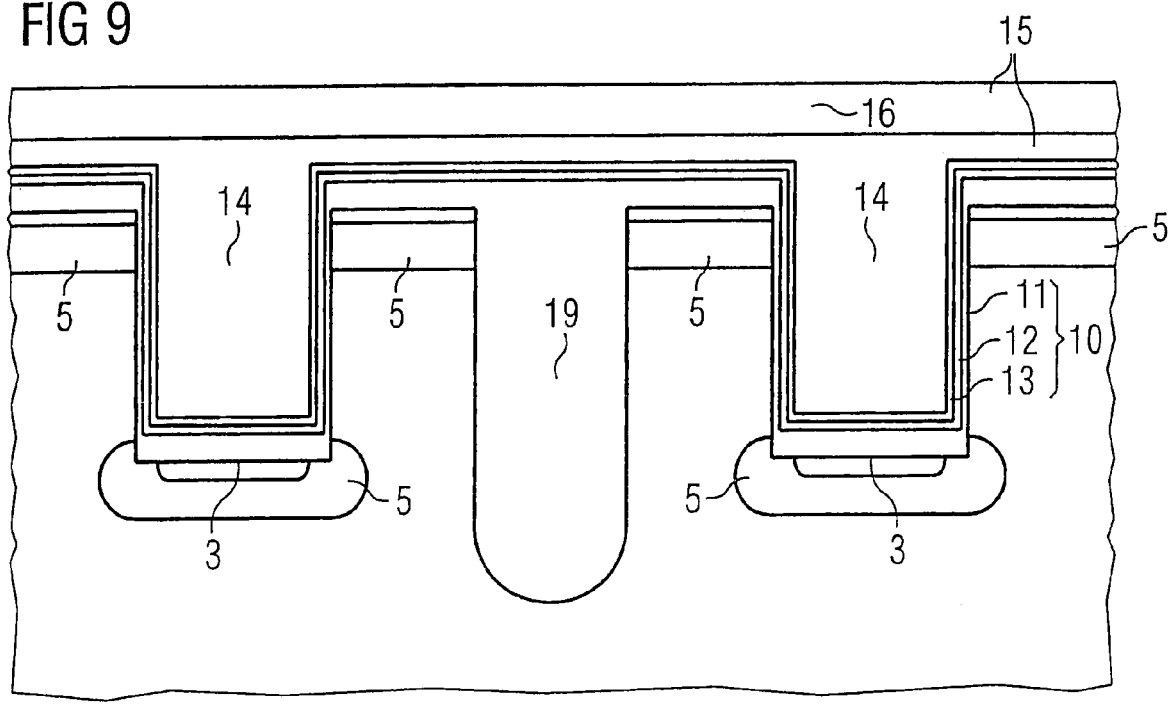
FIG. 9 shows a cross section thought an arrangement of memory cells in trenches that are arranged parallel to one another and isolated from one another by insulation strips.

FIG. 9 illustrates a cross section through an arrangement of a plurality of trenches with memory cells that are arranged at a distance from and parallel to one another. A grid-type arrangement of memory cells, in particular of NROM memory cells, may be formed in a memory cell array in the manner illustrated. The lower source and drain regions 5 at the bottoms 3 of the trenches may be insulated from one another in each case by a trench-like insulation strip 19, which is in each case arranged parallel to the trenches between two mutually adjacent trenches, which is at least the depth of the source/drain regions 5 arranged at the bottoms 3 of the trenches and is preferably fabricated as an oxide-filled trench in each case in the manner of an STI structure.

What is claimed is:

1. A method for fabricating memory cells, the method comprising:
    etching a trench having a bottom and lateral walls at a top side of a silicon region;
    introducing dopant for forming source and drain regions into the top side of the silicon region, the source and drain regions being adjacent to a top side of the trench and at the bottom of the trench;
    covering the top side of the silicon region which adjoins the trench and the bottom of the trench with a resist mask;
    implanting nitrogen into the lateral walls of the trench;
    removing the resist mask;
    forming a metal silicide layer in those regions of a top side of the silicon region which adjoin the trench and at the bottom of the trench;
    simultaneously forming a gate dielectric at the lateral walls of the trench and an oxide layer at the top sides of said source and drain regions over the metal silicide layer; and
    forming a gate electrode in the trench, the gate dielectric arranged between the gate electrode and the lateral walls of the trench.

2. The method according to claim 1, wherein the metal silicide layer is fabricated as a $CoSi_2$ layer.

3. The method according to claim 2, wherein forming the metal silicide layer comprises performing a salicide process.

4. The method according to claim 1, wherein the gate dielectric comprises a lower boundary layer of a storage layer, the method further comprising:
    forming the storage layer over the lower boundary layer; and
    forming an upper boundary layer over the storage layer.

5. The method according to claim 4, wherein the upper and lower boundary layers comprise oxide layers and wherein the storage layer comprises a nitride layer.

6. The method according to claim 1, wherein the silicon region comprises a silicon layer.

7. The method according to claim 1, wherein the silicon region comprises a silicon substrate.

8. The method according to claim 1, further comprising forming a word line that is electrically coupled to the gate electrode.

9. A method for fabricating a memory cell, the method comprising:
   etching a trench having a bottom and lateral walls at a top side of a silicon region;
   introducing dopants for forming source and drain regions into the silicon region in an area adjoining the trench and at the bottom of the trench;
   forming spacers at the lateral walls of the trench;
   forming a metal silicide layer in those regions of the top side of the silicon region that adjoin the trench and at the bottom of the trench;
   providing an electrically insulating layer at top sides of the source and drain regions, the electrically insulating layer overlying the metal silicide layer;
   removing the spacers;
   forming a gate dielectric layer at the lateral walls of the trench and simultaneously reinforcing the electrically insulating layer at the top side of the source and drain regions; and
   forming a gate electrode in the trench, the gate dielectric layer being arranged between the gate electrode and the lateral walls of the trench.

10. The method according to claim 9, wherein the metal silicide layer comprises a $CoSi_2$ layer.

11. The method according to claim 10, wherein forming the metal silicide layer comprises performing a salicide process.

12. The method according to claim 9, wherein forming a gate dielectric layer comprises forming a lower boundary layer, the method further comprising:
   forming a storage layer over the lower boundary layer; and
   forming an upper boundary layer over the storage layer.

13. The method according to claim 12, wherein the lower boundary layer and the electrically insulating layer comprise oxide layers.

14. The method according to claim 13, wherein the storage layer comprises a nitride layer and the upper boundary layer comprises an oxide layer.

15. The method according to claim 9, further comprising forming a thermal oxide at the lateral walls of the trench prior to forming the spacers at the lateral walls of the trench.

16. The method according to claim 9, further comprising forming a word line that is electrically coupled to the gate electrode.

17. A method for fabricating a memory cell, the method comprising:
   etching a trench having a bottom and lateral walls at a top side of a silicon region;
   introducing dopants for forming source and drain regions into the silicon region in an area adjoining the trench and at the bottom of the trench;
   forming an oxide layer at the lateral walls of the trench;
   forming spacers at the lateral walls of the trench overlying the oxide layer;
   performing a salicide process to form a metal silicide layer in those regions of the top side of the silicon region that adjoin the trench and at the bottom of the trench;
   providing an electrically insulating layer at top sides of the source and drain regions, the electrically insulating layer overlying the metal silicide layer;
   removing the spacers to uncover the oxide layer, the oxide layer serving as a lower boundary layer;
   forming a storage layer over the lower boundary layer;
   forming an upper boundary layer over the storage layer;
   forming a gate electrode in the trench; and
   forming a word line that is electrically coupled to the gate electrode.

18. The method according to claim 17, wherein the metal silicide layer comprises a $CoSi_2$ layer.

19. The method according to claim 17, wherein the upper and lower boundary layers comprise oxide layers and wherein the storage layer comprises a nitride layer.

20. The method according to claim 19, wherein providing the electrically insulating layer comprises forming an oxide layer.

* * * * *

UNITED STATES PATENT AND TRADEMARK OFFICE
CERTIFICATE OF CORRECTION

PATENT NO. : 7,323,388 B2
APPLICATION NO. : 11/072695
DATED : January 29, 2008
INVENTOR(S) : Deppe et al.

Page 1 of 1

It is certified that error appears in the above-identified patent and that said Letters Patent is hereby corrected as shown below:

Col. 4, line 4, delete "thought" and insert --through--.
Col. 4, line 8, after with, insert --the--.
Col. 4, line 36, after a, insert --semiconductor body 1 made of silicon, into which a trench 2 is etched at a top side. Instead of a--.
Col. 4, line 43, delete "week" and insert --weak--.
Col. 4, line 53, after in, delete --a--.
Col. 5, line 9, delete "SiO2" and insert --$SiO_2$--.

Signed and Sealed this

Twentieth Day of May, 2008

JON W. DUDAS
*Director of the United States Patent and Trademark Office*